United States Patent [19]
Elliott et al.

[11] Patent Number: 5,786,745
[45] Date of Patent: *Jul. 28, 1998

[54] ELECTRONIC PACKAGE AND METHOD

[75] Inventors: Alexander J. Elliott, Tempe; Lonne L. Mays, Gilbert, both of Ariz.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 597,307

[22] Filed: Feb. 6, 1996

[51] Int. Cl.⁶ .................................................. H01C 1/08
[52] U.S. Cl. .................... 338/51; 257/706; 174/16.3; 361/690; 361/715; 361/763; 361/773; 338/273; 338/276; 338/275; 338/53
[58] Field of Search .................... 338/53, 54, 57, 338/59, 318, 275, 273, 276, 51, 60, 61; 361/690, 704, 715, 717–718, 722, 728, 730, 760, 763–764, 773; 257/706, 712, 713; 174/16.3

[56] References Cited

U.S. PATENT DOCUMENTS

| | | | |
|---|---|---|---|
| 995,051 | 6/1911 | Ayer | 338/57 |
| 1,868,620 | 7/1932 | Wiegand | 338/253 |
| 2,358,406 | 9/1944 | Lightgam | |
| 2,545,661 | 3/1951 | Hansson | 174/12 R |
| 2,880,296 | 3/1959 | Berkelhamer | 338/275 |
| 3,260,787 | 7/1966 | Finch | 174/15.3 |
| 3,355,532 | 11/1967 | Bracht et al. | 264/234 |
| 3,636,493 | 1/1972 | Caddock | 338/52 |
| 4,695,927 | 9/1987 | Barre | 361/760 |
| 5,164,884 | 11/1992 | Pesola | 361/386 |
| 5,353,194 | 10/1994 | Volz et al. | 361/690 |
| 5,604,666 | 2/1997 | Yoshizawa | 361/735 |

FOREIGN PATENT DOCUMENTS

| | | | |
|---|---|---|---|
| 2453685 | 5/1976 | Germany | 338/51 |
| 4-255294 | 9/1992 | Japan | 361/704 |
| 42459 | of 1916 | Sweden | 338/51 |
| 125756 | 11/1989 | U.S.S.R. | 338/61 |

OTHER PUBLICATIONS

Translation of Tane et al. (JP 3-233747).
Translation of Breitfleder (DE 245685).
General Instrument,Power Semiconductor Division, Data Book 11th Edition, Jan. 1994, p. 3 and p. 368.

*Primary Examiner*—Michael L. Gellner
*Assistant Examiner*—Karl Easthom
*Attorney, Agent, or Firm*—Robert F. Hightower

[57] ABSTRACT

A package (10) has outermost surfaces (12, 13, 14, 16) that form a polygon shape. The body (11) of the package (10) has axial symmetry about an axis (21). A lead (22) exits the package along the axis (21).

7 Claims, 2 Drawing Sheets

ELECTRONIC PACKAGE AND METHOD

BACKGROUND OF THE INVENTION

The present invention relates, in general, to packages and more particularly, to a novel package for electronic devices including semiconductors, resistors, and the like.

In the past, the electronic industry has utilized a variety of packages to encapsulate semiconductor devices such as rectifiers, diodes, and zener diodes. Typically, such packages have a cylindrical body with plated leads exiting opposite ends of the body. One disadvantage of these prior art packages is difficulty in surface mounting. During attachment to a printed circuit board or other electronic interconnect substrate, it is difficult to maintain the cylindrical packages at the proper attachment point. Thus, the printed circuit board often is defective because of improper connections.

Another problem is heat dissipation. The cylindrical shaped body has a very small area in contact with the underlying electronic substrate. Consequently, there is very little heat conduction from the package to the substrate thereby resulting in low power dissipation. Additionally, the cylindrical body has a small surface area exposed to air flow and provides inefficient convection dissipation of heat.

Accordingly, it is desirable to have a package that is easily surface mounted, that provides a large area in contact with an underlying printed circuit board, and that provides efficient convection cooling.

DETAILED DESCRIPTION OF THE DRAWINGS

Figure 1:
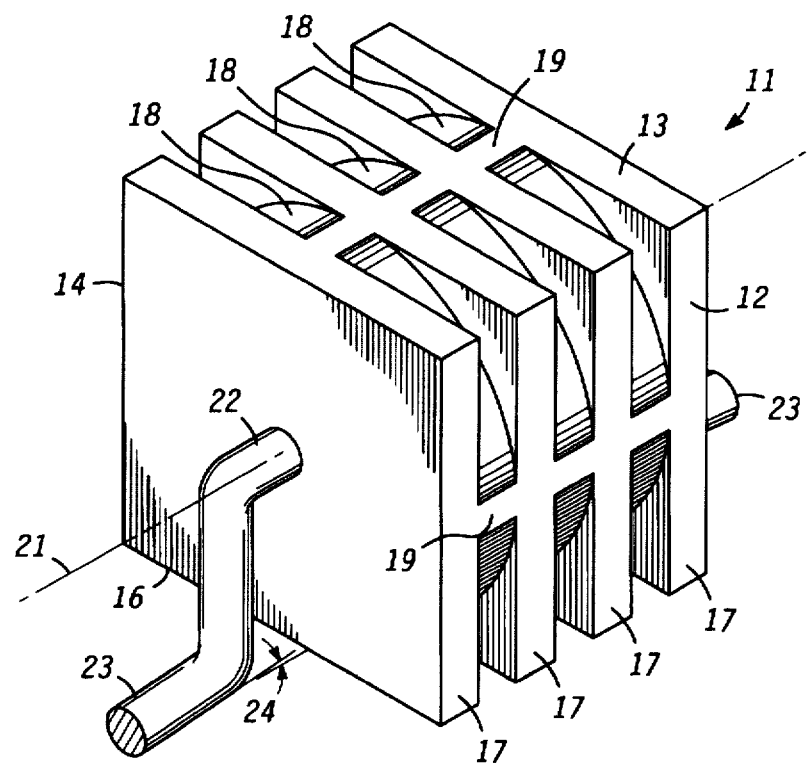
FIG. 1 is an isometric view illustrating an embodiment of a package accordance with the present invention.

FIG. 1 illustrates an isometric view of an electronic package 10 suitable for housing electronic components such as semiconductor devices, resistors, and other electronic devices. Package 10 includes a body 11 that assists forming surface mount leads on package 10, that facilitates mounting package 10 to a printed wiring board, and that facilitates high power dissipation for package 10. Body 11 has a plurality of ribs or fins 17 that extend substantially perpendicularly to a major axis 21 of both body 11 and package 10. Fins 17 typically have a polygon shape that has axial symmetry about axis 21. Each fin 17 has a side that forms both a side of the polygon shape and the outermost surface of body 11. For the polygon shown in FIG. 1, fins 17 have a first surface or side 12, a second surface or side 13, a third surface or side 14, and a fourth surface or side 16 that form the outermost surfaces of body 11 and form each side of the polygon shape. Thus, each side of the polygon shape forms a flat surface that is in a plane substantially parallel to axis 21 wherein each side of the polygon shape forms one outermost surface of body 11.

Plurality of fins 17 are separated by interposed spaces 18 that are portions of body 11 recessed closer to axis 21 than are outermost surfaces of body 11 or sides 12, 13, 14, and 16. Typically, the portion of body 11 in spaces 18 has a different shape than the outermost surfaces of body 11. As shown in FIG. 1, the portion of body 11 in spaces 18 has a cylindrical shape having a diameter substantially equal to the width of fins 17. However, the portion of body 11 within spaces 18 can have other shapes and other dimensions, such as, the same polygon shape as fins 17 but having a smaller dimension than fins 17. The diameter of the portion of body 11 in spaces 18 is sufficient to cover and protect the internal elements of package 10. Internal to package 10, generally is a heat sink to which a semiconductor die is attached. The diameter of body 11 in spaces 18 must be sufficient to cover and protect such internal elements. The width of spaces 18, that is, the distance between fins 17, should be sufficient to allow for convection cooling of fins 17.

Each outermost surface of package 10 has a flat surface 19 suitable to facilitate use of a vacuum pick-up or vacuum end-effector to manipulate package 10. In the preferred embodiment, flat surface 19 runs the length of each side of body 11 and has a width and length suitable for the vacuum pick-up. Such vacuum end-effectors typically are used for picking and placing semiconductor packages in surface mount assembly operations, and are well known to those skilled in the art.

Package 10 also includes a lead 22 that exits an end surface of body 11 along axis 21. Only one lead 22 is shown because the other lead in hidden by package 10, however, package 10 generally has another lead extending from another end (not shown) and along axis 21. Typically, lead 22 is bent or formed to facilitate surface mounting package 10 to a printed wiring board or other electronic substrate. For such surface mount applications, lead 22 is bent so that a distal portion 23 of lead 22 has an outer surface that is substantially coplanar to one of the flat surfaces formed by the sides of the polygon shape of fins 17. Distal portion 23 generally is less than approximately 0.5 millimeters (0.5 mm) above or below the plane formed by the side of fin 17. In the preferred embodiment, portion 23 is closer to axis 21 than the surface of fin 17 by less than approximately 0.5 millimeters. Such a configuration allows the outer most surface of fin 17, or package 10, to rest flat on the electronic substrate while portion 23 of lead 22 is just slightly above the substrate. This insures that package 10 rests flat on the electronic substrate and remains in the proper position for mounting thereby facilitating surface mounting of package 10. Consequently, package 10 can be placed in the proper position of the printed wiring board or electronic substrate, and does not move during assembly thereby insuring proper assembly of the substrate. Additionally, because of the axial symmetry, lead 22 can be formed relative to any side of package 10. Thus, automated lead forming machinery does not have to identify a specific side before forming lead 22, but can use any side. This reduces the manufacturing costs of package 10.

The polygon shape of package 10 also assists in manufacturing package 10. Lead 22 can be formed substantially coplanar to anyone of the surfaces of package 10. Because all sides of package 10 are identical, lead 22 can be formed coplanar to any one of the surfaces so that a particular surface does not have to be identified during the lead forming process thereby minimizing the manufacturing costs of package 10.

Because of fins 17, package 10 has a large surface area that increases the thermal dissipation of package 10. Typically, package 10 has a surface area that is approximately twenty percent larger than prior art packages. It is believed that package 10 provides at least twenty percent higher convection cooling power dissipation than prior art packages. Additionally, the flat surface of each side of the polygon shape of package 10 allows package 10 to rest flat on the underlying electronic substrate. This provides increased conduction cooling from package 10 to the underlying substrate thereby increasing the thermal dissipation of package 10.

Typically, body 11 is molded around the encapsulated semiconductor die and heat sink using molding techniques that are well known to those skilled in the art. The material used for body 11 should be easily moldable for such applications. Additionally, the material used for body 11 can have thermal fillers that increase the power dissipation of package 10.

Figure 2:
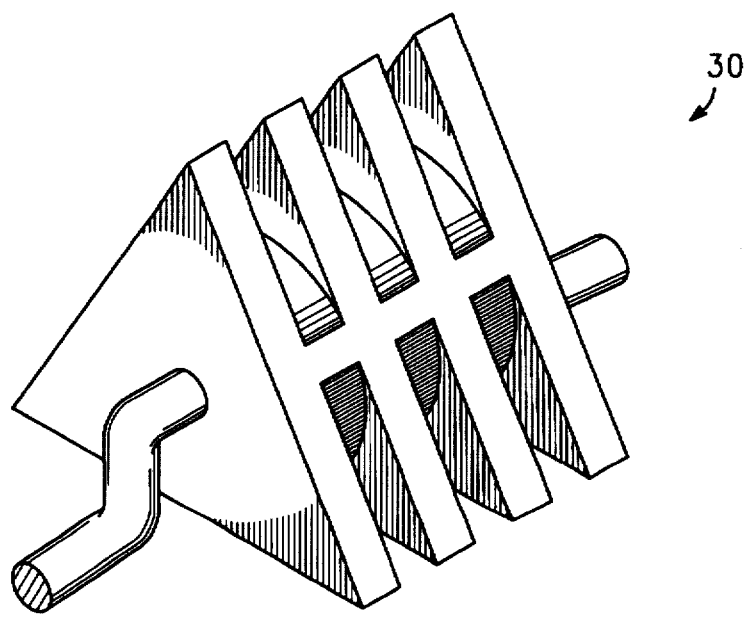
FIGS. 2 and 3 illustrate isometric views of alternate embodiments of the package of FIG. 1 in accordance with the present invention.

FIG. 2 illustrates an isometric view of a package 30 that is an alternate embodiment to package 10 shown in FIG. 1. Package 30 has fins and an outer most surface that are formed in a triangular shaped polygon. Package 30 functions similar to package 10 and has similar advantages and characteristics.

Figure 3:
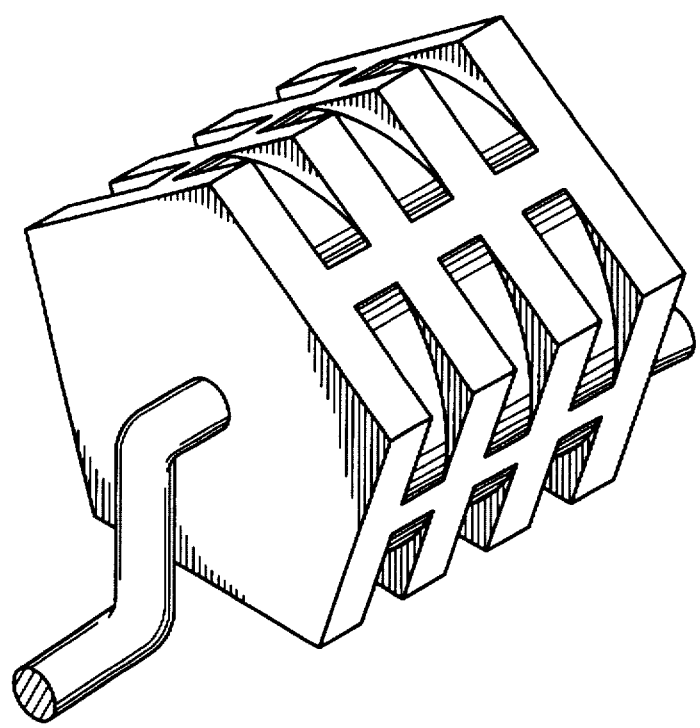

FIG. 3 illustrates a package 40 that is an alternate embodiment of package 10 shown in FIG. 1. Package 40 has pentagon shaped fins and a pentagon shaped outer polygon shape. Package 40 functions similar to package 10 and has similar advantages and characteristics.

As shown in FIGS. 1–3, the packages have fins and surface mount formed leads. However, the package can have other embodiments. In an alternate embodiment, the package can have solid outermost surfaces instead of fins and spaces. In another embodiment, the leads can be through-hole instead of surface mount type leads.

By now it should be appreciated that there has been provided a novel electronic package and method. By providing a body with polygon shaped outermost surfaces, the package remains substantially stationary during assembly to underlying electronic substrates. The polygon shape also assists in forming leads of the package to have a fixed position relative to a surface of the package thereby lowering the manufacturing costs. Utilizing fins or ribs to form the polygon shaped outermost surface of the body increases the convection cooling capabilities of the body. Additionally, the polygon shaped outermost surfaces of the body increases conduction cooling between the body and the underlying substrate thereby increasing the power dissipation capabilities of the package.

We claim:

1. An electronic package comprising:

a one piece body having an axis and sides with fins and with flat surfaces between and connecting the fins wherein the fins and flat surfaces of each side have an outermost surface in a plane so that the planes of the outermost surfaces of all sides intersect to form a shape of a polygon, the polygon and each fin having axial symmetry about the axis so that each said plane is substantially parallel to the axis; and a lead having a diameter that is smaller than a thickness of the one piece body exiting the body along the axis and wherein the lead is bent to have a first portion substantially perpendicular to at least one of said planes of the outermost surfaces and a second portion substantially perpendicular to the first portion of the lead and also has an outer surface that is substantially coplanar to the one plane.

2. The package of claim 1 wherein the outermost surfaces are formed by a plurality of fins extending substantially perpendicular to the axis.

3. The package of claim 1 wherein a portion of the flat surface is suitable for use by a vacuum pick-up device.

4. The package of claim 1 wherein the polygon is a square.

5. The package of claim 1 wherein the polygon is a triangle.

6. The package of claim 1 wherein the polygon is a rectangle.

7. The package of claim 1 wherein the polygon is a pentagon.

\* \* \* \* \*